United States Patent [19]
Pulvirenti

[11] Patent Number: 6,140,680
[45] Date of Patent: Oct. 31, 2000

[54] INTEGRATED POWER SEMICONDUCTOR TRANSISTOR WITH CURRENT SENSING

[75] Inventor: Francesco Pulvirenti, Acireale, Italy

[73] Assignee: Thomson Microelectronics, S.R.L., Agrate Brianaza, Italy

[21] Appl. No.: 09/115,436

[22] Filed: Jul. 14, 1998

[30] Foreign Application Priority Data

Jul. 14, 1997 [EP] European Pat. Off. ............ 9783034

[51] Int. Cl.$^7$ .................................. H01L 31/113
[52] U.S. Cl. .................. 257/341; 257/342; 257/350; 257/226; 257/233; 257/266; 257/207
[58] Field of Search .................. 257/341, 342, 257/350, 226, 233, 266, 207

[56] References Cited

U.S. PATENT DOCUMENTS

| | | | |
|---|---|---|---|
| 5,365,085 | 11/1994 | Tokura et al. | 257/139 |
| 5,543,632 | 8/1996 | Ashley | 257/48 |

FOREIGN PATENT DOCUMENTS

| | | |
|---|---|---|
| 0132861 A1 | 2/1985 | European Pat. Off. . |
| 0252236 A3 | 1/1988 | European Pat. Off. . |
| 0649176 A2 | 4/1995 | European Pat. Off. . |
| 0670600 A2 | 9/1995 | European Pat. Off. . |
| 0772242 A1 | 5/1997 | European Pat. Off. . |
| 0782201 A1 | 7/1997 | European Pat. Off. . |
| 59-047763 | 3/1984 | Japan . |
| 05129604 | 5/1993 | Japan . |

*Primary Examiner*—Fetsum Abraham
*Attorney, Agent, or Firm*—Jenkens & Gilchrist; Thedore E. Galanthay

[57] ABSTRACT

The present invention relates to semiconductor integrated transistors comprising a conduction section and a sense section for the current flowing through the conduction section both sections being located within a region. To ensure that sensing is accurate and takes into account that the surface of the power transistor reach in operation a non-uniform temperature, the conduction section and sense section are located in such a manner that, in operation, the temperature distributions of the two sections are substantially equal.

26 Claims, 4 Drawing Sheets

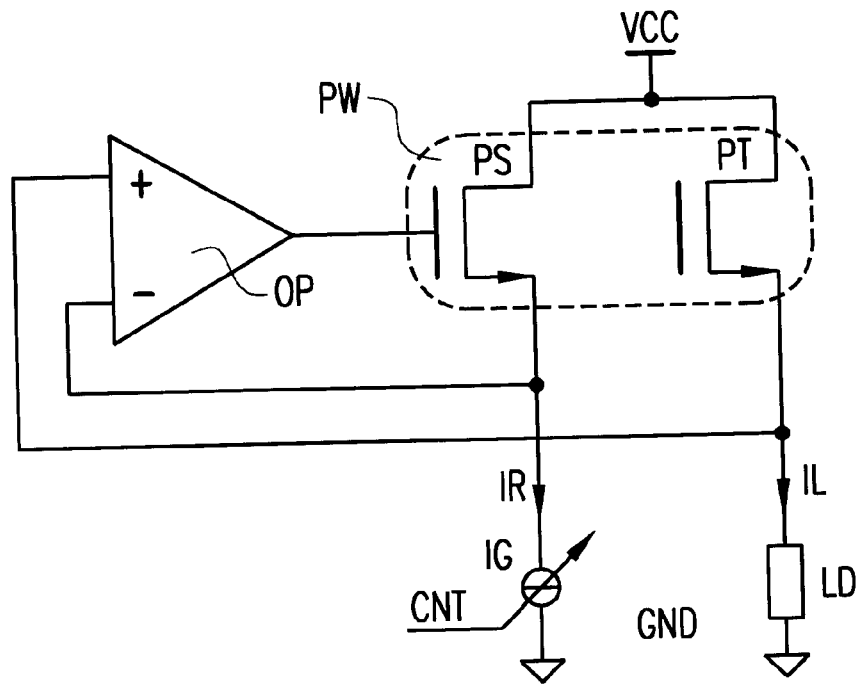
FIG. 1
(PRIOR ART)
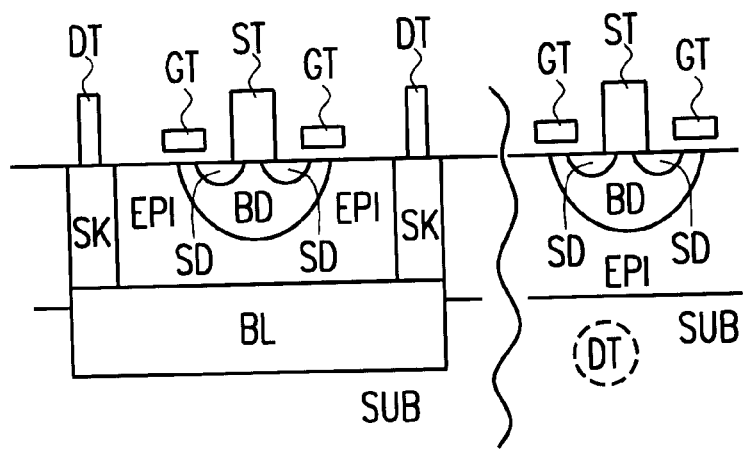
FIG. 2A
(PRIOR ART)
FIG. 2B
(PRIOR ART)

INTEGRATED POWER SEMICONDUCTOR TRANSISTOR WITH CURRENT SENSING

FIELD OF THE INVENTION

This invention relates to a method of sensing current in a transistor, and to semiconductor transistors of the integrated type which implement the method.

BACKGROUND OF THE INVENTION

Sensing a current which is flowing along the main conduction path of a transistor, i.e., the collector-emitter current for BJT transistors and the source-drain current for MOSFET transistors, is a fairly common practice, especially with power transistors. Sensing a current can be useful to protect the transistor against overloads or, in certain applications, to control the current being delivered to the load by the transistor.

The most common method for effecting this sensing is to connect, in series with the main conduction path of the transistor, a resistor having an exactly known, very low and stable value, and then measure the voltage drop across the resistor. However, the voltage drop introduced by the resistor is somewhat disadvantageous for certain applications. In addition, the resistor dissipates a certain amount of electric power which is undesirable.

To overcome such drawbacks, another method has long been in use for semiconductor transistors of the integrated type, which consists of fabricating two transistors on the same chip, namely, a conduction one, indicated as PT in FIG. 1, and a sense one, indicated as PS in FIG. 1, which transistors differ from each other by their conduction areas. If their control voltages, VGS in the instance of the MOSFET transistors in FIG. 1, are made identical, then the ratio of the currents flowing through them will be equal to the ratio of their conduction areas. FIG. 1 is described more fully below.

As is well known, power transistors of the integrated type are often formed by a plurality of identical elements, usually known as "cells." FIG. 2B shows a cross-section of an exemplary cell for MOSFET transistors, and FIG. 3 is a schematic top view of a power transistor PW comprising a plurality of such cells located within a region RG of the chip. FIG. 3 shows, as an example, an array of 12 columns and 9 rows.

The cell of FIG. 2B is formed within an epitaxial layer EPI of the N-type, overlying a substrate SUB of the P type, which layer constitutes the drain terminal DT. The cell is formed by a bulk well BD of the P type wherein two source wells SD of the N+ type are provided. The wells RD and SD are surface contacted together by a metal structure forming the source terminal ST. Located at the surface included between the edges of the wells SD and the edge of the well BD are two polysilicon structures which form the control terminal GT and are isolated from the surface by an insulating material. When looked from the top, the cell appears as a closed, e.g., circular, area corresponding to the well BD and wherein is a girdle, e.g., a circular one, corresponding to the wells SD.

The cells forming the power transistor PW are divided into two sections: (i) the conduction elements CE which are connected together in parallel and form the conduction transistor PT, i.e., the conduction section of the power transistor PW, and (ii) the sense elements SE which are connected together in parallel and form the sense transistor PS, i.e., the sense section of the power transistor PW.

As shown in FIG. 3, a set of (eight in the example) elements next to each other are usually selected for the sense elements SE. In this way, the necessary connections become easier to make. In the example of FIG. 3, the ratio of the conduction areas is 8/100. In practical applications, this ratio is generally much lower, e.g., 8/8000=1/1000. FIGS. 2B, 3, and also 2A are described more fully below.

By this method, definitely better sensing results are obtained than those to be obtained with the resistor, and with none of its disadvantages. By first approximation, no sensing errors occur. Of course, the area occupied by the transistor on the chip is slightly larger. However, it has been found by second approximation analysis that the current sensed by the sense transistor PS is not exactly proportional to that flowing through the conduction transistor PT. This discrepancy has been attributed to the fact that, in electric operation, the region RG occupied by the power transistor has a temperature which varies according to position. For example, the middle zone may be at 70° C. and, at the same time, the peripheral zones be at 50° C. Furthermore, each of the conduction and sense elements is affected by its instant temperature, so that the current through them will be different for the same control voltage.

It is the object of this invention to provide a method of sensing a current of a transistor which is more accurate than conventional methods and to provide transistors for implementation of the method.

Further advantageous aspects of this invention are set forth below.

SUMMARY OF THE INVENTION

The fundamental key to the invention is to have the conduction and sense sections located in such a manner that, in operation of the transistor, the conduction and sense sections will have substantially identical temperature distributions. The operation and behavior of the two sections thus is substantially equal and the resulting sensing is highly accurate.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF THE DRAWINGS

FIG. 1 is a circuit diagram of a conventional system for sensing and controlling a current in a MOSFET power transistor;

FIG. 2A is a sectional view through a first conventional MOSFET power transistor cell;

FIG. 2B is a sectional view through a second conventional MOSFET power transistor cell;

DETAILED DESCRIPTION OF A PREFERRED EMBODIMENT OF THE INVENTION

Figure 3:
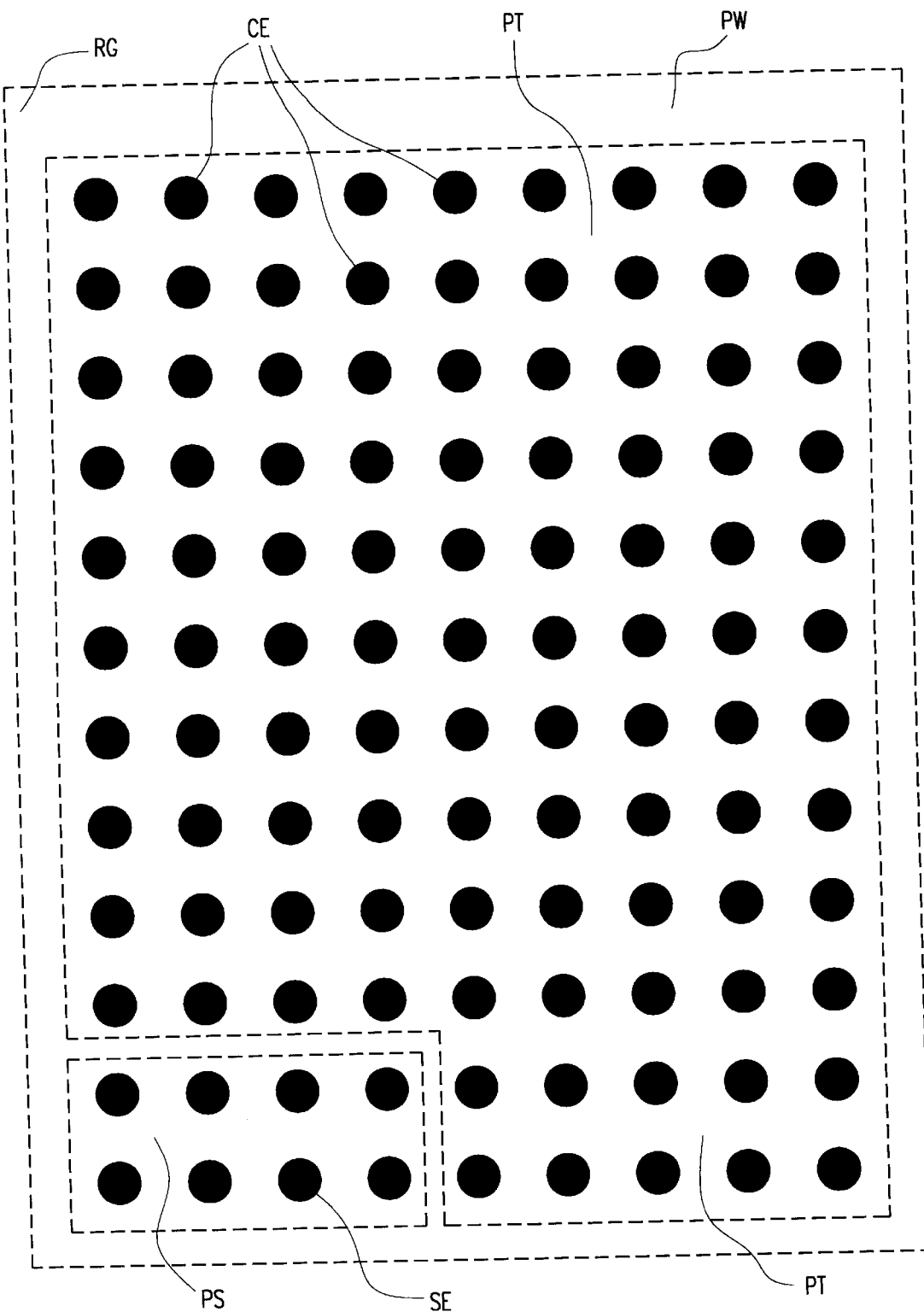
FIG. 3 is a schematic top view of a conventional "cellular" power transistor.

Shown in FIG. 1 is a circuit diagram of a conventional system for sensing and controlling a current in a MOSFET power transistor PW. The transistor PW comprises a proper conduction section corresponding to a conduction transistor PT and a sense section corresponding to a sense transistor PS. The transistors PT and PS have drain terminals connected together and to a supply voltage reference VCC, and control terminals jointly connected to the output of an operational amplifier OP. The source terminal of the transistor PT is connected to a load LD referred to a ground GND. The source terminal of the transistor PS is connected to a controlled current generator IG, also referred to as the ground GND. The generator IG has a control terminal CNT whereby the value of the current therethrough can be determined. The source terminals of the transistors PS and PT are connected to the inverting and non-inverting inputs, respectively, of the operational amplifier OP.

Because of the high gain of the operational amplifier OP, the potentials at its inverting and non-inverting inputs are substantially the same in operation of the system. Accordingly, the transistors PS and PT have substantially equal voltages VGS, and the ratio of the values of their respective currents will be equal to the ratio of their respective conduction areas, e.g., "k". If the generator IG forces a current IR on the transistor PS, neglecting the current drawn by the inverting input of the amplifier OP which is quite small, a current IL flowing through the load LD will be "k" times IR, neglecting the current drawn by the non-inverting of the amplifier OP which also is quite small.

In operation of the system as shown in FIG. 1, the region RG of the chip occupied by the transistor PW will rise in temperature. It has been determined, from actual measurements and simulations, that the curve of temperature versus position has a shape resembling that of a Gaussian function, when a narrow horizontal or vertical portion of this region is taken. As the length of the portion, i.e., one dimension of the region RG, is increased, the curve changes to become substantially flat at the middle, while retaining its Gaussian shape at the ends. When the region RG is divided into small square or rectangular portions having, for example, the same dimensions as the transistor cells (lateral length and diameter in the 10-micron range) and assuming the temperature to be uniform inside these portions, the statistical distribution of temperature will have a pattern which depends on: the electrical and environmental operation conditions of the transistor; the shape, size and layout of the cells within the region RG; as well as on similar parameters relating to whatever may be around the region RG on the chip. For example, a likely temperature distribution is that 50% of the region RG is at a temperature in the range of 65° to 75° C., 30% in the 55° to 650° C. range, and 20% in the 45° to 55° C. range.

The method of this invention for sensing the current in a semiconductor transistor of the integrated type applies to transistors which comprise a conduction section located within a region of the chip and a sense section for the current flowing through the conduction section, and provides for the sense section to be located inside that region, but such that, in operation of the transistor, its temperature distribution is substantially the same as the temperature distribution of the conduction section. Thus, the environmental conditions of the two sections will be substantially identical, this being prerequisite for a highly accurate sensing, regardless of the mode of operating the sense section. Of course, for high accuracy sensing, the sense section should be implemented by integrated structures similar to those forming the conduction section. In this way, not only their environmental conditions but also their operation and performance will be the same.

There are basically two ways to fabricate power transistors: a "cellular" construction as described, for example, in Patent Application EP 252 236, and a "mesh" construction as described, for example, in Patent Applications EP 772 242 and EP 782 201. The method of this invention applies to both constructions.

Figure 4:
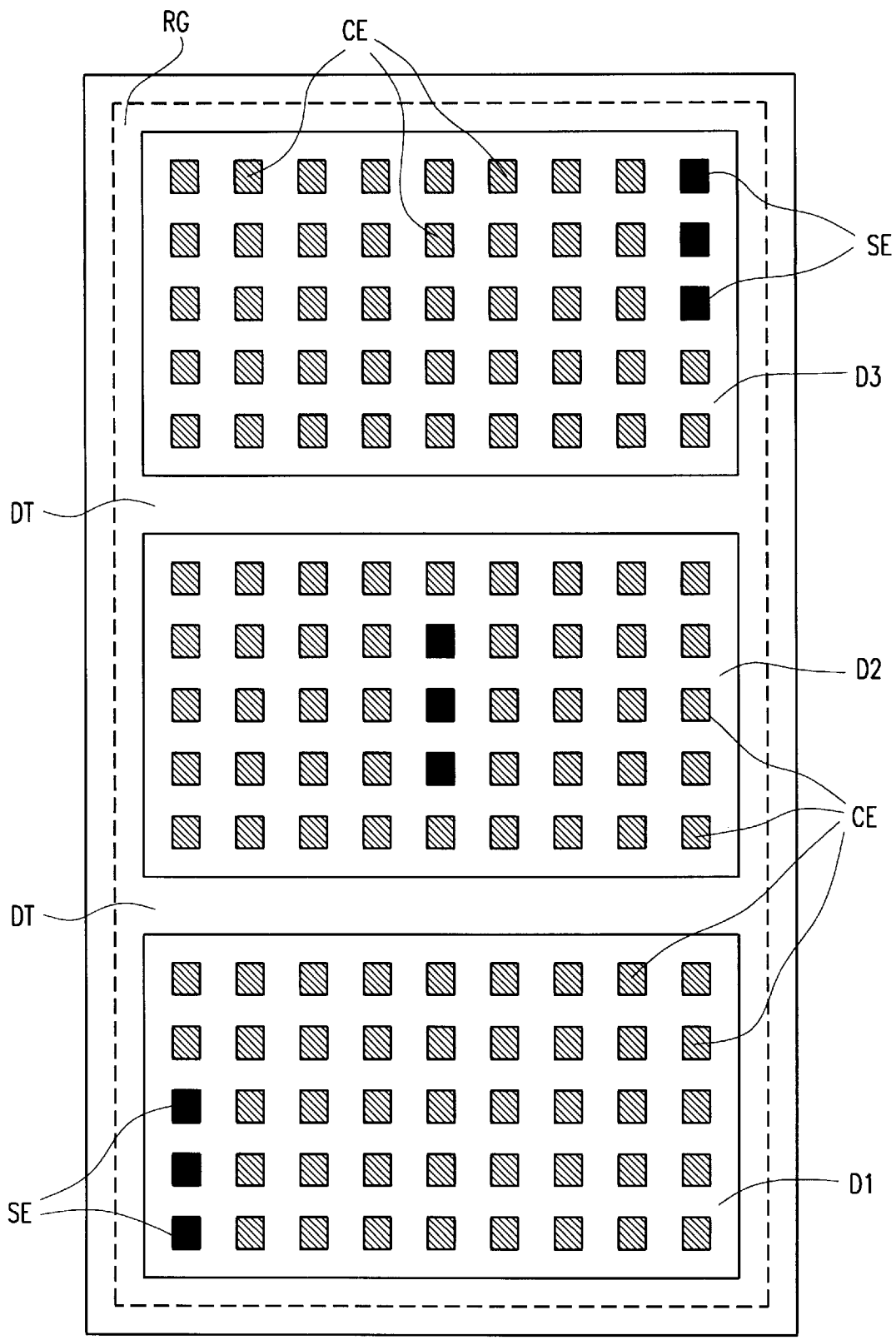
FIG. 4 is a schematic top view of a "cellular" power transistor according to the invention.

Referring to FIG. 4, the semiconductor integrated transistor of the "cellular" type, according to this invention, comprises:

a) a conduction section formed by a first plurality of conduction elements CE located within a region RG and connected in parallel together; and b) a sense section for the current flowing through the conduction section which is formed by a second plurality of sense elements SE, similar to the conduction elements CE and being located within the region RG and connected in parallel together;

the position of the elements CE, SE being such that, in operation of the transistor, the temperature distribution of the conduction elements CE is substantially equal to the temperature distribution of the sense elements SE.

The cell used for the transistor of FIG. 4 has the cross-section shown in FIG. 2A. It is fabricated within an epitaxial layer EPI of the N-type, overlying a substrate SUB of the P type. The cell is formed by a bulk well BD of the P type containing two source wells SD of the N+ type. The wells BD and SD are surface contacted to each other by a metal structure which forms the source terminal ST. Two polysilicon structures, forming the control terminal GT are isolated from the surface by an insulating material, and are located at the surface between the edges of the wells SD and the edge of the well BD.

A buried layer BL of the N+ type is provided between the substrate SUB and the layer EPI, at the cell location. The layer BL is surface contacted by means of metal structures that form the drain terminal DT, through sinker wells of the N+ type.

Looking from the top, the cell appears as a closed, e.g., square, area corresponding is to the well BD, on whose inside is a, e.g., square, girdle corresponding to the wells SD. The layer BL is generally a single layer shared by several cells. In the example of FIG. 4, the layer BL is shared by all the cells CE, SE of the transistor, and underlies them across the whole region RG. In order to reduce the resistance of this layer, the well SK and the drain metal structure DT are provided in the form of three rectangular girdles joining one another and defining three subregions D1, D2, D3. The provision of a well SK and structure DT within the region RG may affect the temperature distribution somewhat.

Figure 5:
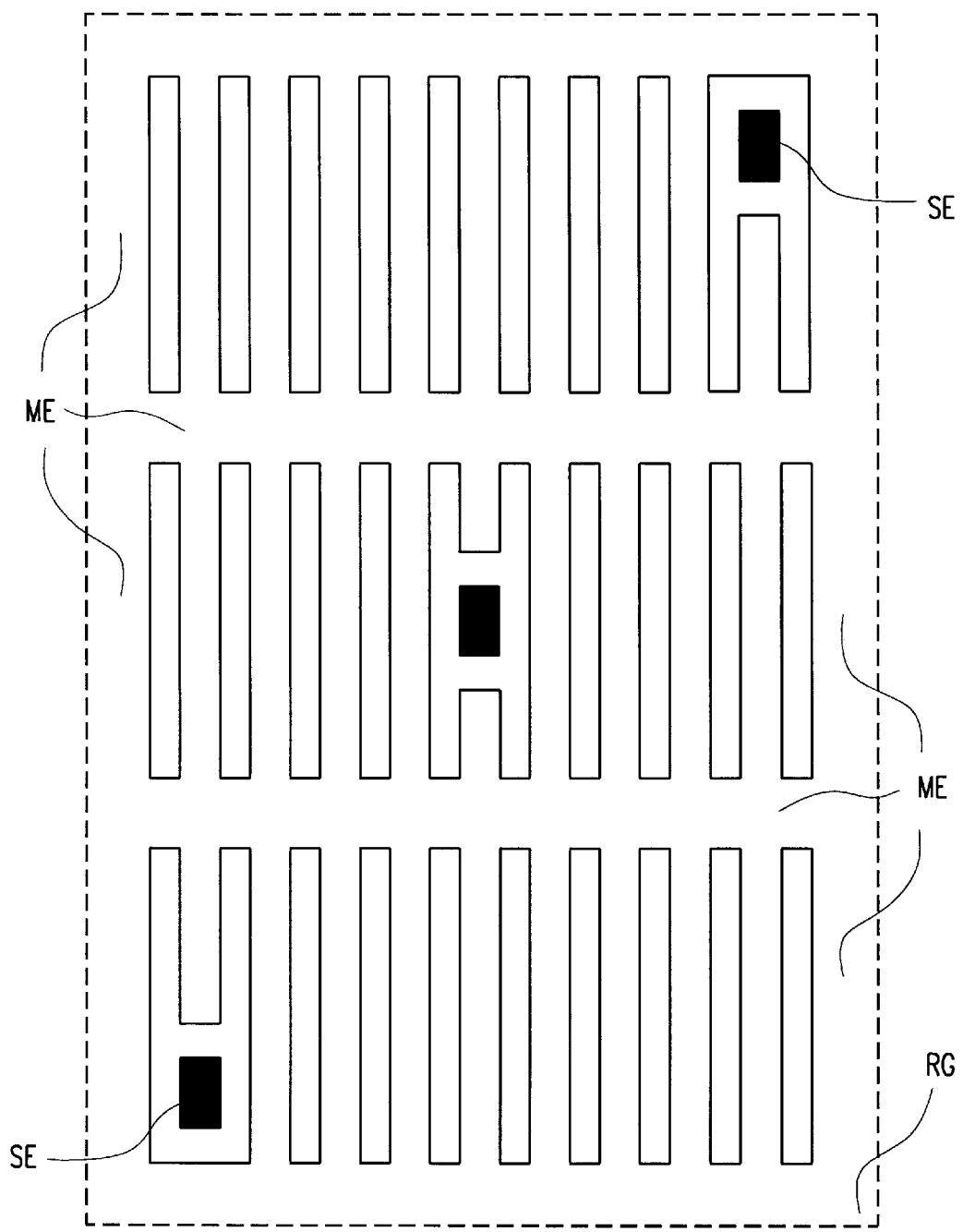
FIG. 5 is a schematic top view of a "mesh" power transistor according to the invention.

Referring to FIG. 5, the semiconductor integrated transistor of the "mesh" type, according to this invention, comprises:

a) a conduction section formed by at least one conduction mesh ME located inside a region RG; and b) a sense section for the current flowing through the conduction section which is formed by a plurality of sense elements SE, structurally similar to the conduction mesh ME and being located within the region RG and connected in parallel together;

the position of the sense elements SE being such that, in operation of the transistor, the temperature distribution of the conduction mesh(es) ME is substantially equal to the temperature distribution of the sense elements SE.

The mesh ME of the transistor in FIG. 5 can be split up into three substantially equal parts joined to one another. Each part is formed of a rectangular girdle having a given thickness and its internal area crossed by a plurality of thinner parallel strips which are joined at the girdle. The transistor of FIG. 5 could also be thought of as having three conduction meshes which are joined together at three contiguous subregions, respectively.

The cross-section of a strip may be similar to that of a cell. The strip used for the transistor of FIG. 5 has the cross-section shown in FIG. 2B. This is formed within an epitaxial layer EPI of the N-type, over a substrate SUB of the P type defining the drain terminal DT. The strip is formed of a bulk well BD of the P type containing two source wells SD of the N+ type. The wells BD and SD are surface contacted together by a metal structure which forms the source terminal ST. Provided at the surface between the edges of the well SD and the edge of the well BD are two polysilicon structures forming the control terminal GT which are isolated from the surface by an insulating material.

The well BD corresponds essentially to the mesh ME, and accordingly, has the same shape. The wells SD are usually present in the strips only. The sense elements SE are obtained by so interrupting the strips, and hence the well BD, as to form isolated wells from the mesh ME. Inside these isolated wells, the wells SD are laid such that they are out of all contact with the layer EPI. Of course, the shape and structure of the mesh will affect the temperature distribution.

The following considerations basically apply to either type of power transistors.

Where the region RG has a substantially rectangular shape, the sense elements SE can be laid substantially along at least one of the rectangle diagonals. In this way, a sense element can be placed at the hottest spot, the center of the rectangle, and at the coldest spot, i.e., the edge of the rectangle. For the sake of design simplicity, the sense elements SE can be laid out in a substantially uniform manner along the diagonal line. This usually would not meet exactly the condition for equality of the temperature distributions.

As previously mentioned, particularly in relation to FIG. 4, the region RG may be divided into non-contiguous subregions D1, D2, D3. In this case, it is preferable to have at least one sense element located within each subregion. Where the subregions are laid contiguously, this division has a fairly limited effect on temperature distribution.

Should the non-contiguous layout of the subregions significantly affect the distribution of temperature, then a plurality of sense elements SE are better provided in each subregion, and their positions should be such that, in operation of the transistor, their temperature distribution is substantially the same as the temperature distribution of the corresponding subregion.

As the skilled persons in the art will readily recognize, this invention also is applicable to BJT power transistors, even though the invention has been described in connection with MOSFET power transistors. In fact, BJT power transistors also admit of "cellular" and "mesh" constructions and have a control voltage, the voltage VBE. Such MOSFET and BJT power transistors can either be sold as discrete components or included within more complex integrated circuits which also accommodate, for example, driving circuitry for the power transistor.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention as described in the following claims.

I claim:

1. A semiconductor integrated circuit, comprising:
   a conduction section comprising a plurality of conduction elements located within a region and connected in parallel together so as to form a power transistor; and
   a sense section for sensing current flowing through said conduction elements and comprising a plurality of sense elements having a structure similar to the conduction elements, located within said region and connected in parallel together so as to form a sense transistor;
   wherein said sense elements are disposed in end portions and a central portion of said region so that, in operation of the semiconductor integrated circuit, the temperature distribution of the conduction elements is substantially equal to the temperature distribution of the sense elements.

2. The semiconductor integrated circuit according to claim 1, wherein said region is substantially rectangular in shape and said sense elements are located substantially along at least one diagonal line of the region.

3. The semiconductor integrated circuit according to claim 2, wherein said sense elements are located substantially uniformly along the at least one diagonal line of the region.

4. The semiconductor integrated circuit according to claim 2, wherein said region is divided into non-contiguous subregions.

5. The semiconductor integrated circuit according to claim 4, wherein each non-contiguous subregion contains at least one of said sense elements.

6. The semiconductor integrated circuit according to claim 5, wherein each non-contiguous subregion contains a plurality of said sense elements, the sense elements positioned in the non-contiguous subregions such that, in operation of the semiconductor integrated circuit, the temperature distribution of the sense elements in each non-contiguous subregion is substantially equal to the temperature distribution of the corresponding subregion.

7. The semiconductor integrated circuit according to claim 1, wherein said region is divided into non-contiguous subregions.

8. The semiconductor integrated circuit according to claim 7, wherein each subregion contains at least one of said sense elements.

9. The semiconductor integrated circuit according to claim 8, wherein each subregion contains a plurality of said sense elements, the sense elements positioned such that, in operation of the semiconductor integrated circuit, the temperature distribution of the sense elements in each subregion is substantially equal to the temperature distribution of the corresponding subregion.

10. The semiconductor integrated circuit of claim 1, wherein at least some of the sense elements are disposed substantially in a line passing through the central portion of the region.

11. The semiconductor integrated circuit of claim 10, wherein the at least some of the sense elements are substantially uniformly disposed along the line passing through the central portion of the region.

12. A semiconductor integrated transistor device, comprising:
- a conduction section comprising at least one conduction mesh element located within a region so as to form a power transistor; and
- a sense section for sensing current flowing through said conduction section and comprising a plurality of sense elements that are structurally similar to said at least one conduction mesh element, located within said region and connected in parallel together so as to form a sense transistor;
- wherein the sense elements are disposed in end portions and a central portion of the region such that, in operation of the semiconductor integrated transistor device, the temperature distribution of the at least one conduction mesh element is substantially equal to the temperature distribution of the sense elements.

13. The semiconductor integrated transistor device according to claim 12, wherein said region is substantially rectangular in shape and said sense elements are located substantially along at least one diagonal of the region.

14. The semiconductor integrated transistor device according to claim 13, wherein said sense elements are located substantially uniformly along at least one diagonal of the region.

15. The semiconductor integrated transistor device according to claim 13, wherein said region is divided into non-contiguous subregions.

16. The semiconductor integrated transistor device according to claim 15, wherein each subregion contains at least one of said sense elements.

17. The semiconductor integrated transistor device according to claim 16, wherein each subregion contains a plurality of said sense elements, the sense elements positioned such that, in operation of the semiconductor integrated transistor device, a temperature distribution of the sense elements in each subregion is substantially equal to the temperature distribution of the corresponding subregion.

18. The semiconductor integrated transistor device according to claim 12, wherein said region is divided into non-contiguous subregions.

19. The semiconductor integrated transistor device according to claim 18, wherein each subregion contains at least one of said sense elements.

20. The semiconductor integrated transistor device according to claim 19, wherein each subregion contains a plurality of said sense elements, the sense elements being positioned such that, in operation of the semiconductor integrated transistor device, a temperature distribution of the sense elements in each subregion is substantially equal to the temperature distribution of the corresponding subregion.

21. The semiconductor integrated transistor device according to claim 12, wherein at least some of the sense elements are substantially uniformly disposed along a line passing through the central portion of the region.

22. A power transistor device, comprising:
- a power transistor comprising a plurality of power transistor elements connected in parallel and located within a region on a semiconductor substrate; and
- a sense transistor for sensing a current of the power transistor, comprising a plurality of sense transistor elements connected in parallel and interspersed with the power transistor elements throughout the region so that a temperature distribution across the sense transistor elements is substantially the same as a temperature distribution across the power transistor elements.

23. The power transistor device of claim 22, wherein:
at least some of the sense elements are substantially uniformly disposed along a line passing through a center portion of the region.

24. The power transistor device of claim 22, wherein:
the sense elements are substantially uniformly disposed along at least one line passing through a center portion of the region.

25. The power transistor device of claim 22, wherein:
the power transistor elements and sense transistor elements comprise a cellular array of transistor cells, with a minority of the transistor cells in the cellular array forming the sense transistor elements.

26. The power transistor device of claim 22, wherein:
the power transistor elements comprise a mesh transistor structure.

* * * * *

UNITED STATES PATENT AND TRADEMARK OFFICE
CERTIFICATE OF CORRECTION

PATENT NO : 6,140,680
DATED : October 31, 2000
INVENTOR(S): Francesco Pulvirenti It is certified that error appears in the above-identified patent and that said Letters Patent are hereby corrected as shown below:

Column 3, line 54  Replace "650°"
                      With --65°--

Column 4, line 44  Delete "is"

Signed and Sealed this

First Day of May, 2001

NICHOLAS P. GODICI

*Attest:*

*Attesting Officer*    *Acting Director of the United States Patent and Trademark Office*